United States Patent [19]

Engles et al.

[11] Patent Number: 5,673,227

[45] Date of Patent: Sep. 30, 1997

[54] INTEGRATED CIRCUIT MEMORY WITH MULTIPLEXED REDUNDANT COLUMN DATA PATH

[75] Inventors: Bruce E. Engles; Daniel C. Knightly, both of Austin, Tex.

[73] Assignee: Motorola, Inc., Schaumburg, Ill.

[21] Appl. No.: 645,856

[22] Filed: May 14, 1996

[51] Int. Cl.$^6$ .................................................. G11C 7/00
[52] U.S. Cl. ...................... 365/200; 365/189.02; 371/10.3
[58] Field of Search .......................... 365/200, 225.7, 365/189.02, 51, 63, 230.02; 371/10.1, 10.2, 10.3

[56] References Cited

U.S. PATENT DOCUMENTS

| | | | |
|---|---|---|---|
| 4,566,081 | 1/1986 | Ochii | 365/200 |
| 4,601,019 | 7/1986 | Shah | 365/200 |
| 4,660,179 | 4/1987 | Aoyama | 365/200 |
| 5,268,866 | 12/1993 | Feng | 365/200 |
| 5,404,331 | 4/1995 | McClure | 365/200 |

*Primary Examiner*—David C. Nelms
*Assistant Examiner*—Son Mai
*Attorney, Agent, or Firm*—Daniel D. Hill; J. Gustav Larson

[57] ABSTRACT

An integrated circuit memory (10) has a redundant column (20) located approximately in the middle a memory array (80, 81). Input/output (I/O) blocks (49, 70) are located on a periphery of the memory (10). A redundant multiplexer (24) is coupled to the redundant column (20) and to a top redundant global data line (36) and a bottom redundant global data line (34). Data is routed between the redundant columns (20) and the I/O blocks (49, 70) via the top and bottom redundant global data lines (36, 34) to effectively shorten the redundant global data line, thereby reducing the amount of redundant data line load capacitance. A fuse circuit (50) is used to program which of the top or bottom global data lines (36, 34) replaces a defective data path. This arrangement permits increased redundant array efficiency while achieving the required performance goals.

23 Claims, 2 Drawing Sheets

INTEGRATED CIRCUIT MEMORY WITH MULTIPLEXED REDUNDANT COLUMN DATA PATH

FIELD OF THE INVENTION

This invention relates generally to memories, and more particularly, to a an integrated circuit memory with a multiplexed redundant column data path.

BACKGROUND OF THE INVENTION

As the memory storage capacity of integrated circuit memories increases, the possibility of having manufacturing defects in the rows and columns increases, resulting in decreased manufacturing yields. One way to increase production yields in large integrated circuit memories is to use column and/or row redundancy. In an integrated circuit memory with redundancy, a manufacturing defect in a particular row can be repaired by using a redundant row in place of the defective row. Likewise, a defect in a particular column can be repaired by using a redundant column to replace the defective column.

In order to repair a defective row or column, the defective row or column is deselected and a redundant row or column is assigned in its place by blowing fusible links. The fusible links may be blown using a high-energy laser, or may be blown electrically at probe test. The ability to repair a memory that has only a few defective rows or columns can result in substantially increased manufacturing yields.

A memory using a redundant column should be accessible at the same speed as a memory that has not been repaired using a redundant column. However, a repaired memory may be slower than a memory without a redundant column because additional logic is needed. The additional logic is used to compare each address signal provided to the memory with fuse data to decode which column is selected for repair.

Another problem with column redundancy is determining how many redundant columns to use. Including too many redundant columns will adversely affect the number of die which can be included on a wafer. Including too few redundant columns may reduce manufacturing yield because not all of the defective columns can be repaired. It would be desirable to have a memory with an optimum number of redundant columns, where the redundant columns can be used to repair any location in the array, and where a redundant column can be accessed at about the same speed as a normal column.

DESCRIPTION OF A PREFERRED EMBODIMENT

In an integrated circuit memory in which a conventional "revolutionary" pinout (center power and ground pins) is used, the input/output (I/O) circuitry may be on opposite sides of the memory array. Using a conventional approach, a redundant column is located near the I/O circuit to optimize access speed of the redundant column. However, in a memory having the revolutionary pinout, redundant columns are needed on both sides of the memory array in order to meet this requirement. This may be more redundancy than would be required to repair the array, and may unnecessarily increase the size of the integrated circuit memory.

Generally, the present invention provides an integrated circuit memory with column redundancy which solves the aforementioned problem. Specifically, in a preferred embodiment, the integrated circuit memory is organized into memory arrays with a predetermined number of redundant columns located approximately in the middle of each of the memory arrays. The I/O circuitry is located on the periphery of the integrated circuit memory on each side of the array. Due to the redundant block's location in the middle of the array, it is now approximately equidistant from each I/O portion on the periphery of the memory. In order to improve the redundant block's speed relative to the speed of a normal memory block, the redundant global data line pair's capacitance is reduced. This is accomplished by using a redundant multiplexer to couple the redundant column to a top redundant global data line pair positioned adjacent to the memory array and disposed from the redundant column to a periphery of the memory, and to a bottom redundant global data line pair positioned adjacent to the memory array and disposed from the redundant column to another periphery of the memory. Fuse decode signals are used to route data to or from the redundant column and the I/O portions by providing fuse information to the redundant multiplexer. By locating the redundant columns in the middle of the array and splitting the redundant global data line pair into a top and bottom global data line portion, the length of the redundant data path is shortened, thereby reducing the amount of redundant data line load capacitance. This arrangement increases both the access speed and reduces power consumption of the memory, without unnecessarily increasing the size of the memory with redundant columns on both ends of the memory array.

The redundant multiplexer is coupled to and receives a control signal from a fuse circuit. The fuse circuit serves the dual purpose of programming which global data line pair is replaced by the redundant data line pair, and which I/O pad the data is provided to or received from.

Figure 1:
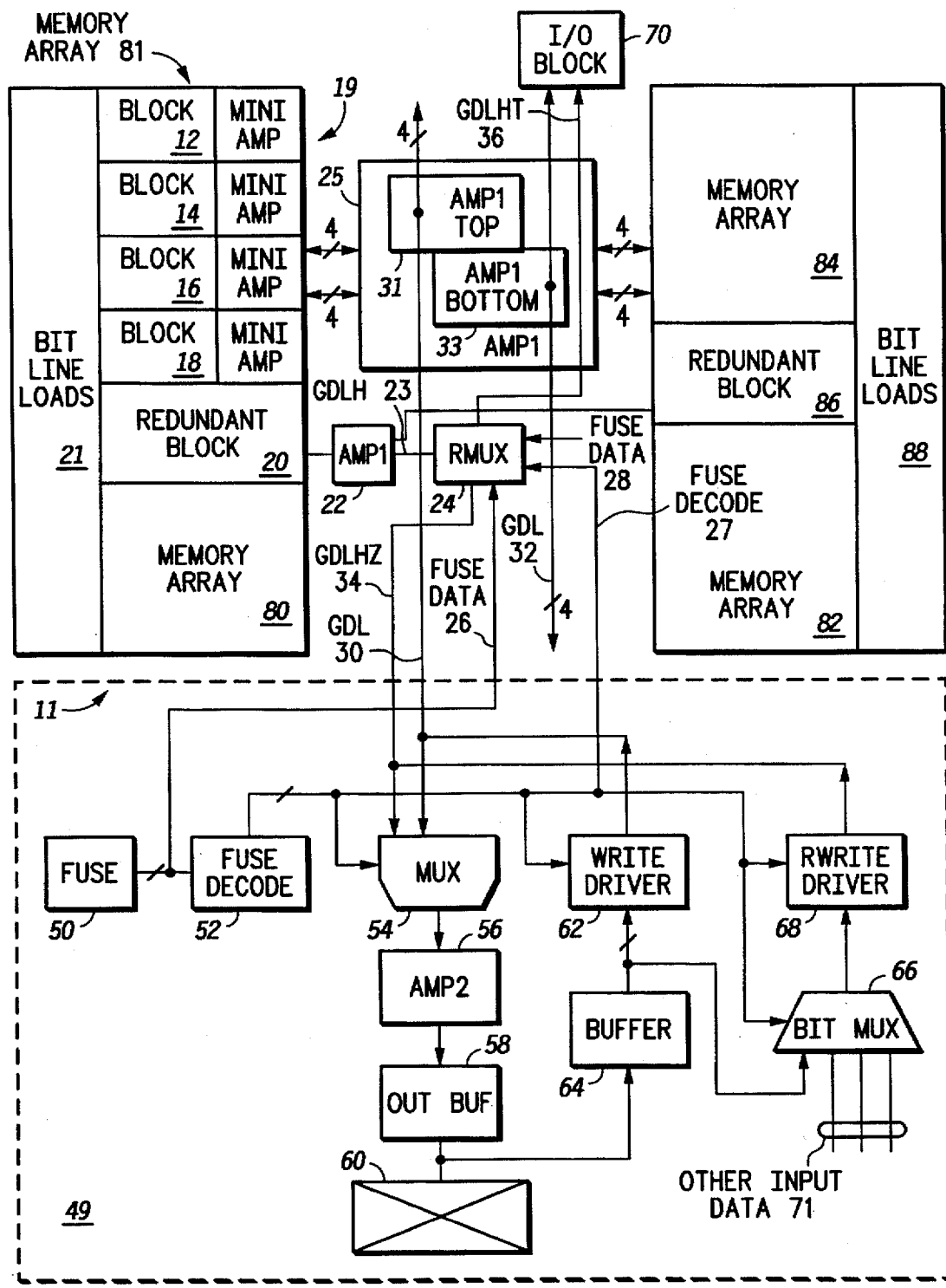
FIG. 1 illustrates, in block diagram form, an integrated circuit memory with redundancy in accordance with the present invention.

The present invention can be more fully described with reference to FIGS. 1–2. FIG. 1 illustrates one embodiment of an integrated circuit memory 10. In the illustrated embodiment, memory 10 is a static random access memory (SRAM) and includes a memory array having a storage portion 11 and I/O blocks 49 and 70. The storage portion 11 comprises two memory arrays. A first left side memory array includes memory array halves 80 and 81, and a second right side memory array includes memory array halves 82 and 84. Both of the memory arrays include a plurality of blocks of memory cells organized in rows and columns. By way of example, memory array half 80 is illustrated having memory blocks 12, 14, 16, and 18. Connected to each of the memory block are sense amplifiers, such as sense amplifiers 19, each labeled "MINI AMP". Located approximately in the middle of both of the memory arrays is a plurality of redundant columns of memory cells. The plurality of redundant columns 20, labeled "REDUNDANT BLOCK", are positioned between memory array halves 80 and 81, and the plurality of redundant columns 86, also labeled "REDUNDANT BLOCK", are positioned between memory array halves 82 and 84. Bit line loads 21 are coupled to memory array halves 80 and 81 and bit line loads 88 are coupled to memory array halves 82 and 84. Local global data lines couple the sense amplifiers, such as sense amplifiers 19, of each of the memory array halves to sense amplifiers 25. Sense amplifiers 25 includes sense amplifier 31, labeled "AMP1 TOP"

and sense amplifier 33, labeled "AMP1 BOTTOM". Sense amplifiers 25 couple data from the local data lines to global data lines such as global data lines 30 and 32, labeled "GDL 30" and "GDL 32". Global data line pairs 30 couples data from sense amplifier 31 of sense amplifier stage 25 to I/O block 49, and global data line pair 32 couples data from sense amplifier 33 of sense amplifier stage 25 to I/O block 70.

The redundant data block 20 is connected through a redundant sense amplifier to sense amplifier 22 labeled "AMP1". Redundant block 86 is connected to sense amplifier 22. Sense amplifier 22 senses and amplifies data from redundant blocks 20 and 86 and couples redundant data from a redundant column via a local data line to redundant multiplexer 24, labeled "RMUX". Redundant multiplexer 24 is coupled to a redundant global data line pair labeled "GDLH 23", to a top redundant global data line pair labeled "GDLHT 36", and to a bottom redundant global data line pair labeled "GDLHZ 34". In addition, redundant multiplexer 24 receives fuse decode data labeled "FUSE DATA 26" and "FUSE DATA 28". FUSE DATA 26 is received from fuses 50, and FUSE DATA 28 is received from fuses similar to fuses 50 located in I/O block 70 (not shown). Likewise, redundant multiplexer 24 receives fuse decode data signals, labeled "FUSE DECODE 27", from fuse decode 52 and corresponding fuse decode data signals from I/O block 70 (not shown). Top redundant global data line pair 36 is coupled to I/O block 70 located at a periphery of memory 10 and bottom redundant global data line pair 34 is coupled to I/O block 49 located at another periphery on an opposite side of memory 10. Note that the global data line pairs 30 and 36 are only two of a plurality of global data line pairs routed between the memory arrays, and is intended for illustration purposes only. Other global data lines and sense amplifiers (not shown) may also be included in memory 10.

The I/O portion 49 comprises fuses 50, fuse decode 52, multiplexer 54, final sense amplifier 56, output buffer 58, I/O pad 60, write driver 62, buffer 64, redundant write driver 68, and input multiplexer 66. Fuses 50 includes a plurality of laser severable, or "blowable" polysilicon fusible link circuits for programming which I/O to is to be replaced with a redundant column when redundancy is used in memory 10 to repair a defective normal column. The fuse decode 52 is coupled to fuses 50. Multiplexer 54 is coupled to GDLHZ 34, GDL 30, and fuse decode 52. Final sense amplifier 56 is coupled to multiplexer 54. Output buffer 58 is coupled to final sense amplifier 56. I/O pad 60 is coupled to output buffer 58. Buffer 64 is coupled to I/O pad 60. Write driver 62 is coupled to fuse decode 52, buffer 64, and GDL 30. Input multiplexer 66 is coupled to fuse decode 52, buffer 64, and receives other input data signals 71 from other I/O pads (not shown). Redundant write driver 68 is coupled to input multiplexer 66, and to the bottom redundant global data line pair 34.

Generally, memory 10 operates as a conventional memory. During a read cycle of integrated circuit memory 10, a row address and a column address are provided to row and column decoders (not shown) to select a memory cell in one of memory blocks 12, 14, 16, or 18, for example. A selected memory cell provides a differential data signal to one of sense amplifiers 19. Each of sense amplifiers 19 is shared between a number of columns. In the illustrated embodiment, sense amplifiers 19 perform a one of four selection of a group of columns, and sense and amplify the differential data signal from the selected memory cell. The data signal from sense amplifier 19 is provided to sense amplifiers 25.

Sense amplifier 31 and sense amplifier 33 amplify and drive the data signal onto global data line pair 30 and global data line pair 32, respectively. Sense amplifiers 31 or 33 will transmit data signals both to the top periphery and to the bottom periphery of the memory 10. Specifically, global data line pair 30 transmits data from sense amplifier 31 to I/O block 49 located at the bottom periphery of the memory array, and global data line pair 32 is connected to sense amplifier 33 and transmits data to top I/O block 70.

A redundant column in the redundant block 20 can replace any defective column in any block located on the left side of memory section 11. Also, a redundant column of redundant block 86, located on the right side of memory section 11 can replace any defective column located in memory array half 82 or memory array half 84. If a redundant column in redundant block 20 repairs a defective column in one of blocks 12, 14, 16, or 18, a fuse blown in fuses 50 is used to program redundant multiplexer 24. Redundant multiplexer 24 redirects the data from GDLH 23 to either the redundant global data line pair 34 or to the redundant global data line pair 36 depending on which I/O portion the defective block is coupled. At the same time, a control signal from fuse decode 52 is provided to multiplexer 54 to select which normal global data line pair the redundant global data line pair is to replace in I/O block 49, for example, during a read cycle of memory 10. Note that when a redundant column replaces a defective column, four contiguous redundant columns are used to replace the defective column and three adjacent columns.

During a write cycle of memory 10, fuse decode 52 provides a control signal to input multiplexer 66 to control whether input data is provided to either write driver 62, or to the redundant driver 68 if a redundant column replaces a defective normal column in the corresponding memory array half. In one embodiment, input multiplexer 66 receives four input data signals from I/O pads, including I/O pad 60. In response to receiving the fuse decode signal from fuse decode 52, the input data signals are mapped to the appropriate write driver 62 or the redundant write driver 68 if redundant write driver 68 replaces, for example, write driver 62. Global data line pair 30 receives differential data signals from I/O block 49, and provides the differential data to a selected column of memory cells in one of the memory blocks. If redundant write driver 68 is selected, the data from buffer 64 is passed via input multiplexer 66 and redundant write driver 68 to bottom redundant global data line pair 34.

A read cycle of memory 10 is essentially the reverse of a write cycle. During a read cycle, a selected memory cell provides a differential data signal to a global data line pair via sense amplifiers 19, a local data line, and sense amplifiers 25. The differential data signal is received by multiplexer 54, and is provided to final sense amplifier 56, which further amplifies the data signal and provides the amplified data signal to output buffer 58. Output buffer 58 buffers and converts the differential data signal to a single ended signal for output external memory 10 via pad 60. Note that global data line pair 30 is coupled to the memory blocks, and provides data signals to I/O block 49 during a read cycle. Also, global data line pair 32 is coupled to the memory blocks and provides data to I/O block 70 during a read cycle.

Redundant global data line pair 34 provides data from I/O portion 49 to redundant multiplexer 24 and redundant global data line pair 36 provides information to the redundant multiplexer 24 from the top I/O portion 70 during a write cycle when column redundancy is used. During a read cycle, when a redundant block 20 replaces a defective column, data is provided from the redundant multiplexer 24 to either of redundant global data line pair 34 or redundant global data line pair 36, depending on fuse information from fuses 50.

Figure 2:
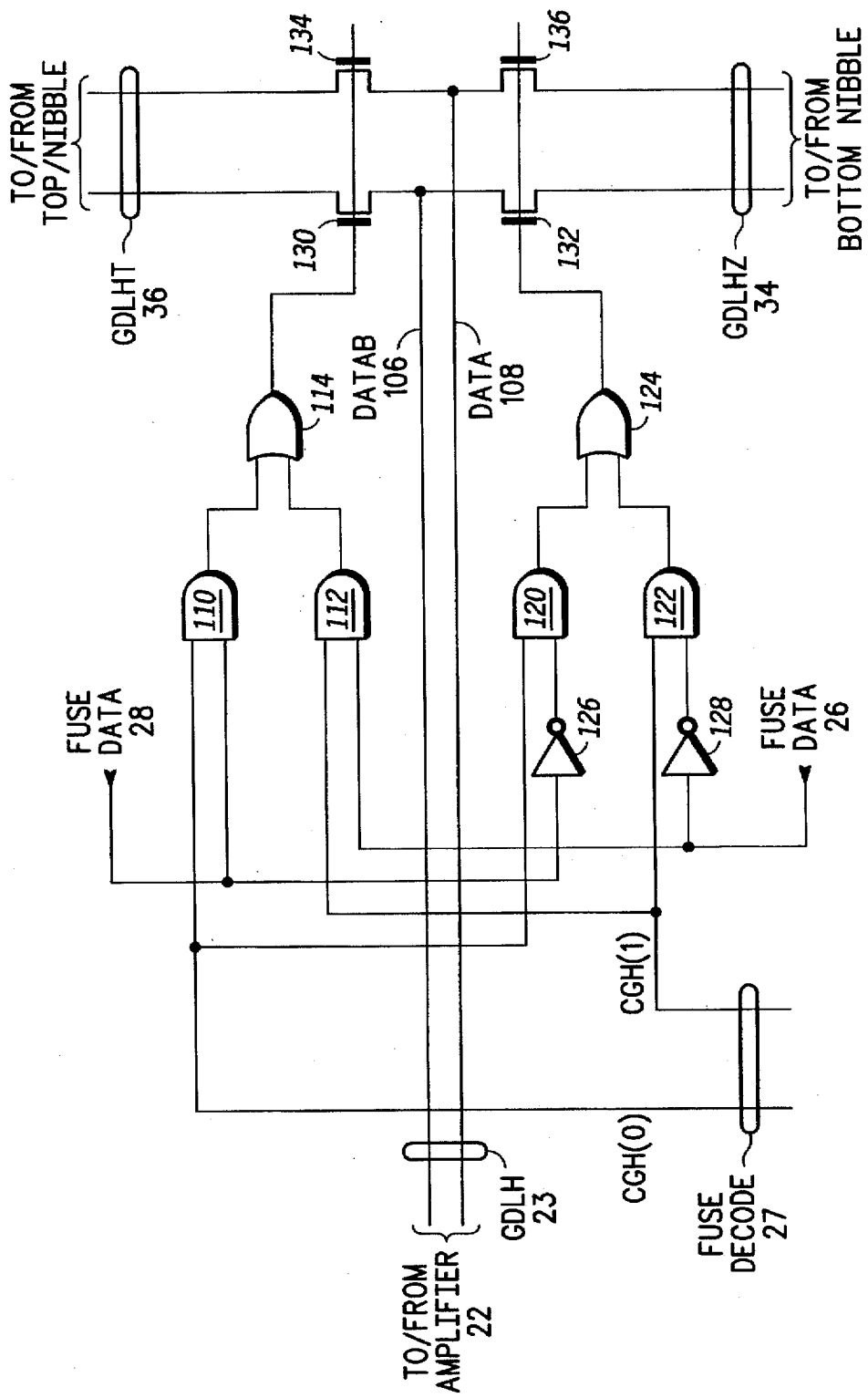
FIG. 2 illustrates, in partial logic diagram form and partial schematic diagram form, a redundant multiplexer of the integrated circuit memory of FIG. 1.

FIG. 2 illustrates, in partial logic diagram form and partial block diagram form, redundant multiplexer 24 of memory 10 of FIG. 1. Redundant multiplexer 24 includes AND logic gates 110, 112, 120, and 122, OR logic gates 114 and 124, inverters 126 and 128, and N-channel transistors 130, 132, 134, and 136.

AND logic gate 110 has a first input terminal for receiving control signal CGH(0), a second input terminal for receiving FUSE DATA 28, and an output terminal. AND gate 112 has a first input terminal for receiving control signal CGH(1), a second input terminal for receiving FUSE DATA 26, and an output terminal. OR logic gate 114 has a first input terminal connected to the output terminal of AND logic gate 110, a second input terminal connected to the output terminal of AND logic gate 112, and an output terminal. Inverter 126 has an input terminal for receiving FUSE DATA 28, and an output terminal. Inverter 128 has an input terminal for receiving FUSE DATA 26, and an output terminal. AND logic gate 120 has an input terminal for receiving control signal CGH(0), and a second input terminal connected to the output terminal of inverter 126, and an output terminal. AND logic gate 122 has a first input terminal for receiving control signal CGH(1), a second input terminal connected to the output terminal of inverter 128, and an output terminal. OR logic gate 124 has a first input terminal connected to the output terminal of AND logic gate 120, a second input terminal connected to the output terminal of AND logic gate 122, and an output terminal.

N-channel transistor 130 has a first current electrode (drain/source terminal) connected to one data line of global data line pair 36, a second current electrode (drain/source terminal) connected to amplifier 22, and a control electrode (gate) connected to the output terminal of OR logic gate 114. N-channel transistor 132 has a first current electrode connected to AMP1 22 (illustrated in FIG. 1), a second current electrode connected to one global data line of the differential global data line pair 34, and a control electrode connected to the output terminal of OR logic gate 124. N-channel transistor 134 has a first current electrode connected to the other of global data line pair 36, a second current electrode connected to sense amplifier 22, and a control electrode connected to the output terminal of OR logic gate 114. N-channel transistor 136 has a first current electrode connected to the sense amplifier 22, a second current electrode connected to the other of global data line pair 34, and a control electrode connected to the output terminal of OR logic gate 124.

During a read cycle, data is provided on redundant local global data line pair 23 from sense amplifier 22 to redundant multiplexer 24. The local global data line pairs 23 from sense amplifier 22 are coupled to N-channel transistors 130, 132, 134, and 136, which route the redundant data to the appropriate redundant global data line pairs 34 or 36. Control signals CGH(0), CGH(1), FUSE DATA 26, and FUSE DATA 28 are derived from redundant fuse and address information and are used to couple the redundant column to the appropriate I/O block. CGH(0) and FUSE DATA 28 are used to select the correct redundant path when redundant block 20 is used to repair a defective column in memory array half 81, or memory array half 80. CGH(1) and FUSE DATA 26 are used to select the correct redundant path when redundant block 86 is used to repair a defect in memory array 82 or 84.

Control signals CGH(0) and CGH(1) are provided by conventional redundant address comparators (not shown) for determining that an address has been repaired with the redundant column. FUSE DATA 28 and FUSE DATA 26 are two of the fuses dictating which normal data path (including the appropriate global data line pair) is being replaced by a redundant path to either of I/O block 49 or I/O block 70.

When redundant data is to be provided to redundant global data line pair 34 from a redundant column, control signal CGH(0) is a logic one and FUSE DATA 28 is a logic zero, and the resulting output signal from OR logic gate 124 is a logic one, selecting, or turning on, N-channel transistors 132 and 136, and deselecting, or turning off, N-channel transistors 130 and 134. Also, redundant data is provided to redundant global data line pair 34 when control signal CGH(1) is a logic one and FUSE DATA 26 is a logic zero, selecting, or turning on, N-channel transistors 132 and 136, and turning off, or deselecting, N-channel transistors 130 and 134.

When redundant data is to be provided to redundant global data line pair 36, control signal CGH(0) is a logic one and FUSE DATA 28 is a logic one, the resulting output signal from OR logic gate 124 is a logic zero, and the output signal from OR logic gate 114 is a logic high, selecting or turning on N-channel transistors 130 and 134, and turning off N-channel transistors 132 and 136. Also, redundant data is provided to redundant global data line pair 34 when control signal CGH(1) is a logic one and FUSE DATA 26 is a logic one, selecting or turning on N-channel transistors 130 and 134, and turning off N-channel transistors 132 and 136.

While the invention has been described in the context of a preferred embodiment, it will be apparent to those skilled in the art that the present invention may be modified in numerous ways and may assume many embodiments other than that specifically set out and described above. For example, the memory of the illustrated embodiment is an SRAM. However, in other embodiments, the memory may be another type of random access memory using column redundancy, such as a dynamic random access memory (DRAM). Accordingly, it is intended by the appended claims to cover all modifications of the invention which fall within the true spirit and scope of the invention.

What is claimed is:

1. An integrated circuit memory, comprising:

a memory array comprising a plurality of memory cells organized in rows and columns;

a redundant column of memory cells;

a first data line portion, positioned adjacent to the memory array and the redundant column and disposed from the redundant column to a first periphery of the integrated circuit memory, for receiving data from the redundant column;

a second data line portion, positioned adjacent to the memory array and the redundant column and disposed from the redundant column to a second periphery of the integrated circuit memory, for receiving data from the redundant column; and a redundant multiplexer, coupled to the first and second data line portions, for determining which of the first or second data line portions is to receive the data from the redundant column.

2. The integrated circuit memory of claim 1, wherein the first and second peripheries are arranged on opposite sides of the memory array.

3. The integrated circuit memory of claim 2, wherein the first data line portion is coupled to a first output portion located at the first periphery and the second data line portion is coupled to a second output portion located at the second periphery.

4. The integrated circuit memory of claim 3, further comprising:

a fuse circuit, coupled to the redundant multiplexer, for providing a control signal for determining which of the first or second data line portions receives the data.

5. The integrated circuit memory of claim 1, wherein the redundant column includes four contiguous redundant columns.

6. The integrated circuit memory of claim 1, wherein the first or second data line portions each provide differential data signals.

7. The integrated circuit memory of claim 1, wherein first or second data line portions both receive data from the redundant column during a read cycle of the integrated circuit memory and provide data to the redundant column during a write cycle of the integrated circuit memory.

8. An integrated circuit memory, comprising:

a memory array comprising a plurality of memory cells organized in rows and columns;

a redundant column of memory cells;

a first data line portion, positioned adjacent to the memory array and the redundant column and disposed from the redundant column to a first periphery of the integrated circuit memory, for receiving data to the redundant column;

a second data line portion, positioned adjacent to the memory array and the redundant column and disposed from the redundant column to a second periphery of the integrated circuit memory, for providing data to the redundant column; and a redundant multiplexer, coupled to the first and second data line portions, for determining which of the first or second data line portions is to provide the data to the redundant column.

9. The integrated circuit memory of claim 8, wherein the first and second peripheries are arranged on opposite sides of the memory array.

10. The integrated circuit memory of claim 9, wherein the first data line portion is coupled to a first output portion located at the first periphery and the second data line portion is coupled to a second output portion located at the second periphery.

11. The integrated circuit memory of claim 10, further comprising:

a fuse circuit, coupled to the redundant multiplexer, for providing a control signal for determining which of the first or second data line portions receives the data.

12. The integrated circuit memory of claim 9, wherein the redundant column includes four contiguous redundant columns.

13. The integrated circuit memory of claim 9, wherein the first or second data line portions each provide differential data signals.

14. The integrated circuit memory of claim 9, wherein first or second data line portions each can receive data from the redundant column during a read cycle of the integrated circuit memory and provide data to the redundant column during a write cycle of the integrated circuit memory based on a fuse data.

15. An integrated circuit memory, comprising:

a memory array comprising a plurality of memory cells organized in rows and columns;

a plurality of global data lines, coupled to the memory array, for providing data to, and receiving data from, the memory array;

a redundant column of memory cells;

a first redundant data line portion, positioned adjacent to the memory array and the redundant column and disposed from the redundant column to a first periphery of the integrated circuit memory, for providing data to and receiving data from the redundant column;

a second redundant data line portion, positioned adjacent to the memory array and the redundant column and disposed from the redundant column to a second periphery of the integrated circuit memory, for providing data to and receiving from data from the redundant column; and a redundant multiplexer, coupled to the first and second redundant data line portions, for determining which of the first or second redundant data line portions is to receive the data from, or provide the data to the redundant column.

16. The integrated circuit memory of claim 15, wherein the first and second peripheries are arranged on opposite ends of the memory array.

17. The integrated circuit memory of claim 15, wherein the first redundant data line portion is coupled to a first output portion located at the first periphery and the second redundant data line portion is coupled to a second output portion located at the second periphery.

18. The integrated circuit memory of claim 17, further comprising:

a fuse circuit, coupled to the redundant multiplexer, for providing a control signal for determining which of the first or second redundant data line portions receives the data.

19. The integrated circuit memory of claim 15, wherein the redundant column includes four contiguous redundant columns.

20. The integrated circuit memory of claim 15, wherein the plurality of global data lines and the first or second redundant data line portions each provide differential data signals.

21. The integrated circuit memory of claim 1, wherein the redundant column is located approximately in the center of the memory array.

22. The integrated circuit memory of claim 8, wherein the redundant column is located approximately in the center of the memory array.

23. The integrated circuit memory of claim 15, wherein the redundant column is located approximately in the center of the memory array.

* * * * *